US009508675B2

United States Patent
Lu et al.

(10) Patent No.: US 9,508,675 B2
(45) Date of Patent: Nov. 29, 2016

(54) MICROELECTRONIC PACKAGE HAVING DIRECT CONTACT HEAT SPREADER AND METHOD OF MANUFACTURING SAME

(71) Applicants: Daoqiang Lu, Chandler, AZ (US); Chuan Hu, Chandler, AZ (US); Gilroy J. Vandentop, Tempe, AZ (US); Shriram Ramanathan, Portland, OR (US); Rajashree Baskaran, Phoenix, AZ (US); Valery M. Dubin, Portland, OR (US)

(72) Inventors: Daoqiang Lu, Chandler, AZ (US); Chuan Hu, Chandler, AZ (US); Gilroy J. Vandentop, Tempe, AZ (US); Shriram Ramanathan, Portland, OR (US); Rajashree Baskaran, Phoenix, AZ (US); Valery M. Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/973,975

(22) Filed: Aug. 22, 2013

(65) Prior Publication Data
US 2013/0344659 A1 Dec. 26, 2013

Related U.S. Application Data (62) Division of application No. 11/242,176, filed on Sep. 30, 2005, now Pat. No. 8,541,876.

(51) Int. Cl.
*H01L 23/00* (2006.01)
*H01L 21/48* (2006.01)
(Continued)

(52) U.S. Cl.
CPC ........... *H01L 24/83* (2013.01); *H01L 21/4871* (2013.01); *H01L 23/3735* (2013.01); *H01L 2224/16* (2013.01); *H01L 2224/16225* (2013.01); *H01L 2224/32225* (2013.01); *H01L 2224/73204* (2013.01); *H01L 2224/73253* (2013.01); *H01L 2224/83* (2013.01); *H01L 2924/01019* (2013.01);
(Continued)

(58) Field of Classification Search
CPC .............................. H01L 21/78; H01L 24/83
USPC ......................................................... 438/125
See application file for complete search history.

(56) References Cited

U.S. PATENT DOCUMENTS 5,287,247 A 2/1994 Smits et al.
5,821,154 A 10/1998 Nashimoto et al.
(Continued)

FOREIGN PATENT DOCUMENTS

DE 102 49 436 A1 5/2003
JP 2006049769 A * 2/2006
(Continued)

OTHER PUBLICATIONS

International Preliminary Report on Patentabitiy mailed Apr. 10, 2008 for PCT/US2006/037520 filed Sep. 26, 2006, 9 pages.
(Continued)

*Primary Examiner* — Ajay K Arora
(74) *Attorney, Agent, or Firm* — Blakely, Sokoloff, Taylor & Zafman LLP (57) ABSTRACT

A method of fabricating a microelectronic package having a direct contact heat spreader, a package formed according to the method, a die-heat spreader combination formed according to the method, and a system incorporating the package. The method comprises metallizing a backside of a microelectronic die to form a heat spreader body directly contacting and fixed to the backside of the die thus yielding a die-heat spreader combination. The package includes the die-heat spreader combination and a substrate bonded to the die.

27 Claims, 6 Drawing Sheets

(51) Int. Cl.
  *H01L 23/373* (2006.01)
  *H01L 21/00* (2006.01)
(52) U.S. Cl.
  CPC ............... *H01L 2924/01078* (2013.01); *H01L 2924/01079* (2013.01); *H01L 2924/10253* (2013.01); *H01L 2924/14* (2013.01); *H01L 2924/18161* (2013.01); *H01L 2924/19106* (2013.01)

(56) References Cited

U.S. PATENT DOCUMENTS

| | | | |
|---|---|---|---|
| 5,872,396 A * | 2/1999 | Kosaki | 257/712 |
| 6,770,513 B1 | 8/2004 | Vikram et al. | |
| 6,841,413 B2 | 1/2005 | Liu et al. | |
| 2001/0030330 A1 * | 10/2001 | Inomoto | 257/127 |
| 2003/0017669 A1 * | 1/2003 | Kiyotoshi et al. | 438/245 |
| 2003/0127715 A1 | 7/2003 | Liu et al. | |
| 2004/0012078 A1 * | 1/2004 | Hortaleza | 257/678 |
| 2004/0096633 A1 | 5/2004 | Matsumura | |
| 2005/0250250 A1 * | 11/2005 | Sung | 438/122 |
| 2005/0277280 A1 | 12/2005 | Brunschwiler et al. | |
| 2006/0028799 A1 | 2/2006 | Tokuhira | |
| 2006/0151861 A1 * | 7/2006 | Noquil et al. | 257/676 |
| 2008/0143379 A1 * | 6/2008 | Norman | H01L 23/50 326/39 |
| 2008/0295879 A1 | 12/2008 | Atanackovic | |

FOREIGN PATENT DOCUMENTS

| | | |
|---|---|---|
| JP | 2007335473 A * | 12/2007 |
| WO | WO 2004/075291 A1 | 9/2004 |

OTHER PUBLICATIONS

Notice of First Office Action from the Chinese State Intellectual Property Office mailed Feb. 5, 2016 for Chinese Patent Application No. 201410027206.3.

* cited by examiner

MICROELECTRONIC PACKAGE HAVING DIRECT CONTACT HEAT SPREADER AND METHOD OF MANUFACTURING SAME

This is a Divisional application of Ser. No. 11/242,176 filed Sep. 30, 2005, which is presently pending.

FIELD

Embodiments of the present invention relate generally to packaging microelectronic dice to produce integrated circuits. It particularly relates to packaging a microelectronic die for greater heat dissipation.

BACKGROUND

Processors and related computer components are becoming more powerful with increasing capabilities, resulting in increasing amounts of heat dissipated from these components. Similarly, package and die sizes of the components are decreasing or remaining the same, which increases the amount of heat energy given off by the component for a given unit of surface area. Furthermore, as computer-related equipment becomes more powerful, more chips are mounted to the printed circuit board, and more and more components are being placed inside the equipment or chassis which is also decreasing in size, resulting in additional heat generation in a smaller volume of space. Increased temperatures can potentially damage the components of the equipment, or reduce the lifetime of the individual components and equipment. In addition, some components are more susceptible to damage resulting from stress and strain occurring during testing, packaging, and use.

One prior art method of bonding a microelectronic die to a heat spreader includes a packaging technology that places one or more thinned dice on a planar heat spreader and secures the dice on to the heat spreader using a bonding process involving an adhesive material, such as solder, or a polymeric material, or, in the alternative, using a direct metallurgical bond, such as may be formed by an interdiffusion of Au (gold) and Si (silicon). Where a metallurgical bond is to be established as noted above, such a prior art process however requires a heating of the die/heat spreader assembly in order to form the bond.

Disadvantageously, however, heating to create the bond as noted above may involve temperatures from about 150 to about 300 degrees Celsius, and may as a result create unwanted stresses and cracking involving the die, the heat spreader and/or the bonding material (or thermal interface material, hereinafter "TIM") therebetween during a cool down phase of the bonding process. In addition, unwanted stresses on the die can disadvantageously have a negative impact on the performance of circuit components on the die. Moreover, where gold is used as part of the solder bonding of the die to the heat spreader, a cost of the package is disadvantageously increased. Furthermore, since the prior art involves the use of a TIM to establish a bonding of the die to the heat spreader, thermal resistance of the TIM can disadvantageously negatively impact a performance of circuit components of the die.

The prior art fails to provide a reliable, simple and cost-effective technique of providing a microelectronic die exhibiting improved heat dissipation characteristics.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION

A method of fabricating a microelectronic package having a direct contact heat spreader, a package formed according to the method, a die-heat spreader combination formed according to the method, and a system incorporating the package are described herein.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

The phrase "one embodiment" is used repeatedly. The phrase generally does not refer to the same embodiment, however, it may. The terms "comprising", "having" and "including" are synonymous, unless the context dictates otherwise.

Figure 1:
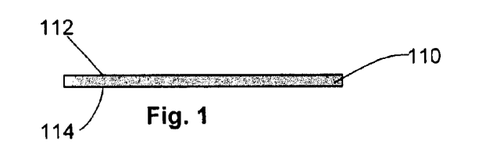
FIG. 1 is a schematic representation of a microelectronic die to be used in a package according to embodiments.

Referring now to FIG. 1 by way of example, embodiments of the present invention comprise providing a microelectronic die, such as die 110 shown in FIG. 1. As shown, die 110 has an active surface 114 and a backside 112 as shown, and includes electrical contacts (not shown) at the active surface thereof for electrical and mechanical bonding to a substrate, as would be recognized by one skilled in the art. Optionally, according to an embodiment, the die may be a thinned die, such as die 110 shown in FIG. 1. In other words, optionally, the thickness of the die may be decreased, for example to about 100 microns or less, by one or more of various techniques known in the art, such as plasma etching, chemical etching, grinding, or polishing. Advantages of providing a thinned die include a reduction in a thermal resistance of a combination of the die with a heat spreader and a resultant improvement in the extraction of heat from the die; an improved compliance of the die to expansions and contractions of the heat spreader and a resultant reduction in stress-induced failures in the solder joints and of the die.

Figure 2:
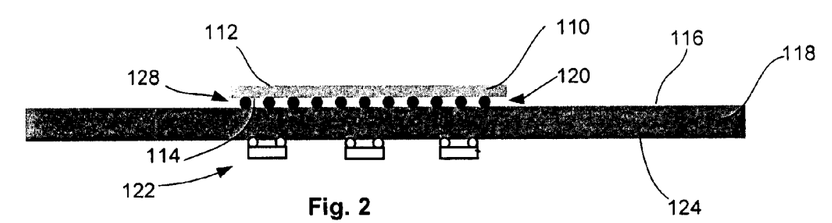
FIGS. 2, 3a and 3b are a schematic representations showing the die of FIG. 1 as having been bonded to a double-sided substrate according to an embodiment.
Figure 3A:
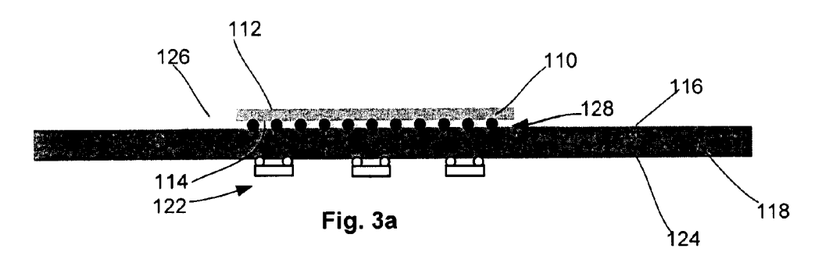
Figure 3B:
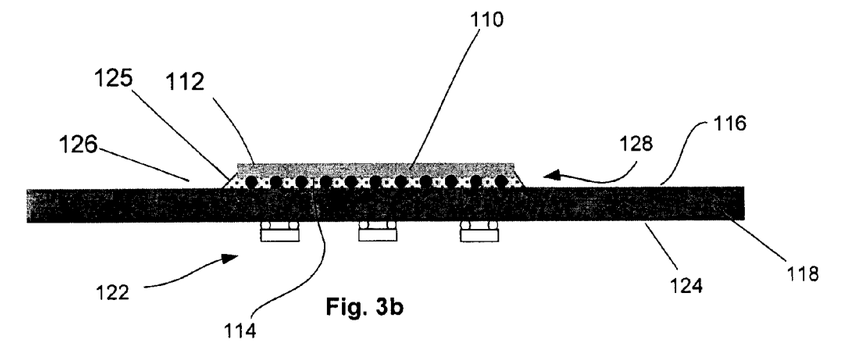

As seen in FIGS. 2, 3a and 3b by way of example, an embodiment of the present invention comprises bonding the die to a microelectronic substrate. By "bonding," what is meant in the context of the present invention is a mechanical and electrical joining between electrical contacts on the active surface of the die and lands on the die-side surface of the substrate. Bonding could include, as would be recognized by one skilled in the art, any of the well known flip-chip packaging processes. Thus, bonding could include, as suggested by way of example in FIG. 2, a selective coating of the lands on the substrate with solder deposits, a registration of the electrical contacts on the active surface of the die with the lands, and a soldering, such as a reflowing, of the contacts on the active surface of the die with the lands on the die-side of the substrate to solidify the solder deposits to form solidified solder joints, and an optional provision of encapsulant and/or underfill material about the solidified solder joints. Thus, FIG. 2 shows die 110 as having been bonded to a die side 116 of microelectronic substrate 118 by way of solidified solder joints 120. As also shown in the figures, optionally, according to an embodiment, the microelectronic substrate is a double-sided substrate, and includes surface mount components such as capacitors at a landside thereof opposite the die side thereof. Thus, substrate 118 as shown is double-sided and includes surface mount components 122 at a landside 124 thereof opposite the die side 116 thereof.

Referring next to FIGS. 3a and 3b by way of example, as noted above, bonding could further include, as would be recognized by one skilled in the art, the provision of an encapsulant, such as encapsulant 126 and/or the provision of underfill material, such as underfill material 125 (FIG. 3b), to fill the gap between the die and the substrate, such as gap 128 shown in FIG. 2. As is well known, encapsulant and/or an underfill material is typically used in order to compensate for differences in coefficients of thermal expansion (CTE's) between the substrate and the die. As shown in FIGS. 3a and 3b, encapsulant, such as encapsulant 126 may be flush with a backside 112 of die 110. There are a number of ways to provide the encapsulant, as would be recognized by one skilled in the art. According to one well known method, as shown in FIG. 3a, a mold (not shown) in the shape of the encapsulant to be provided may be placed about the die and the substrate such that a mold cavity thereof encompasses the gap, and the gap within the mold may be filled with a molded encapsulant material that is flowed into the mold cavity in liquid form and is then solidified in the mold to yield encapsulant 126. In the alternative, as shown in FIG. 3b, a capillary underfill material 125 may be provided in the gap, such as gap 128, using a dispenser. Thereafter a mold may be placed about the die and the substrate as noted above, and a molded encapsulant material 126 then flowed into the mold cavity and cured within the mold to yield the encapsulant. An example of the molding material (i.e. an encapsulant material) may include PLASKON MUF-2A manufactured by the Cookson Electronics Co., Alpharetta, Ga., USA. Optionally still, should there remain any molding material on the backside of the die, planarization according to any one of well known methods, such as, for example, chemical mechanical polishing or grinding, may be applied to the die backside in order to make the encapsulant flush with the same.

It is noted that, while FIGS. 2, 3a and 3b show stages in a flip chip bonding process which involves a sequential soldering and provision of encapsulant and/or underfill material, embodiments further include within their scope a bonding process where both the soldering and the provision of an encapsulant and/or underfill material occur at the same time, such as, for example, a TCB NUF process (or thermo-compression bonding and no-flow underfill process), or any other of the well known flip chip bonding processes, as would be within the knowledge of one skilled in the art.

Figure 4:
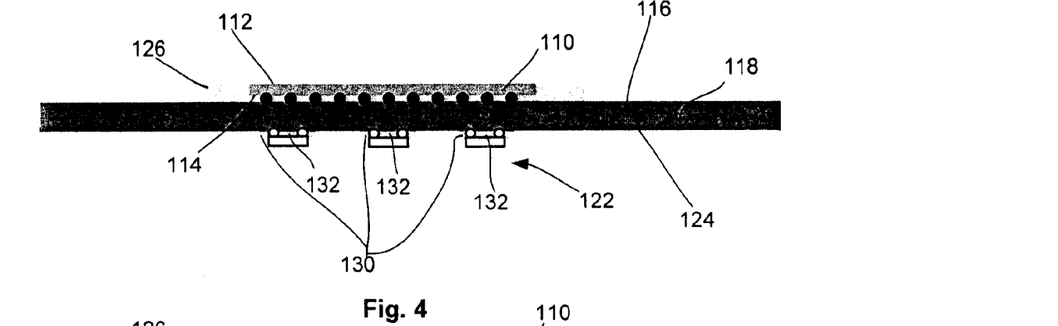
FIG. 4 is a schematic representation of an encapsulant as having been provided between a landside of the substrate of FIG. 3a and an active surface of surface mount components bonded to the substrate according to an embodiment.

As next seen in FIG. 4 by way of example, where the substrate is a double-sided substrate, and further where surface mount components are connected to a landside of the substrate, an embodiment of the present invention comprises providing encapsulant to fill the gaps between the surface mount components and the landside of the substrate, such as encapsulant 130 to fill gaps 132 as shown in FIG. 4. According to an embodiment, the encapsulant, such as encapsulant 130, may be provided according to any one of the methods known to persons skilled in the art, such as, for example, those outlined with respect to encapsulant 126 above.

Figure 5:
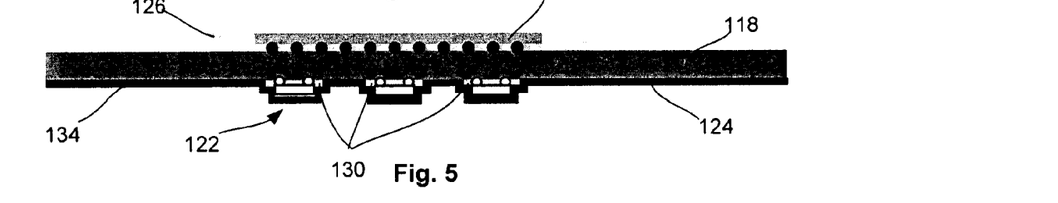
FIG. 5 is a schematic representation showing a protective mask as having been provided to protect the substrate and the surface mount components during metallization according to an embodiment.

Referring next to FIG. 5 by way of example, an embodiment of the present invention comprises providing a protective mask on a landside of the substrate and on a backside of any surface mount components on the landside of the substrate to protect the landside of the substrate and the backside of surface mount components from a metallization process of a backside of the die Thus, as suggested in FIG. 5, an embodiment comprises providing a protective mask 134 onto the landside 124 of substrate 118 and onto the backside of surface mount components 122 as shown. The mask may include a tape, such as, for example, 3M™ Circuit Plating Tape 1279 or INT 600 Masking Tape, manufactured by the Intertronics Company, Oxfordshire, ENGLAND, and may be applied using lamination, in order to protect the landside of the die from a subsequent metallization of the die backside. In the alternative, the mask could be a soft rubber pad with recessed cavities to accommodate the surface mount components on the landside of the substrate. When the substrate is pushed against the rubber pad under a pressure which could be provided by a fixture, the rubber pad will seal and protect the substrate landside. Where there are no surface mount components on the landside of the substrate (not shown), the mask may be applied according to an embodiment to cover the entire landside of the substrate. In addition, according to an embodiment, where surface mount components may be present on the die side of the substrate (not shown), a mask would also be provided on the die side of the substrate, as would be recognized by one skilled in the art.

Figure 6A:
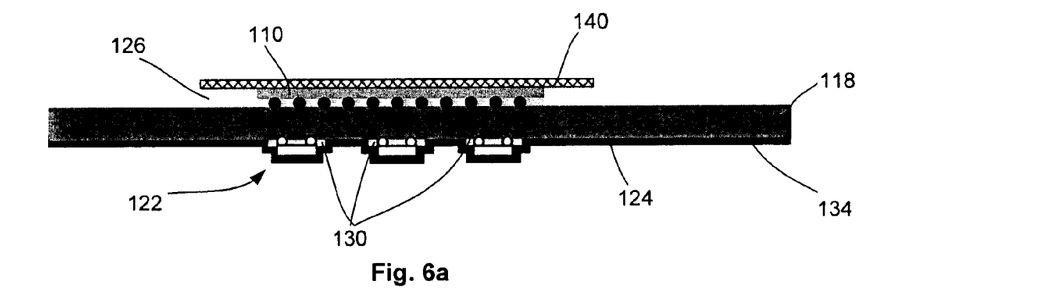
FIGS. 6a and 6b are schematic representations showing a metallization process according to an embodiment.
Figure 6B:
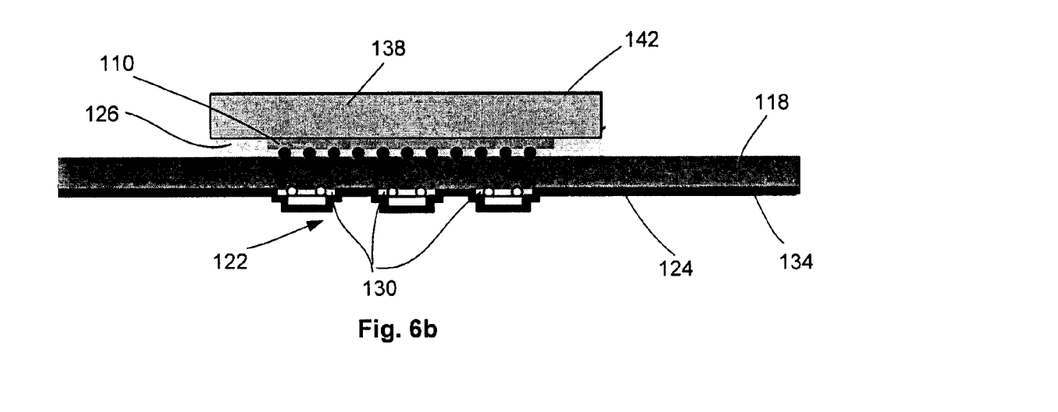

As next seen in FIGS. 6a and 6b by way of example, embodiments of the present invention comprise metallizing a backside of the die to form a heat spreader body directly contacting and fixed to a backside of the die (that is, a "direct contact heat spreader" according to embodiments). By "heat spreader body," what is meant in the context of the present description is a heat spreader including a body made of a highly thermally conductive material to extract heat away from a die, such material including, by way of example, metals such as copper, copper alloys including copper alloys with tungsten, copper laminates, copper composites containing particles having a thermal conductivity above that of copper (i.e. above about 400 W/m/K, such as, for example, diamond), aluminum, aluminum alloys, and the like, By "directly contacting," what is meant in the context of the present description is a contact which is not established by way of a layer intermediate to the die and the heat spreader, such as, for example, by way of a thermal interface material, including, for instance, thermal grease, epoxy, solder, thermally conductive adhesive, or any other of the well known thermal interface materials according to one skilled in the art. According to an embodiment, the heat spreader body may have a thickness of about 0.2 mm to about 3 mm. While FIGS. 6a and 6b show metallization stages of the backside 112 of die 110 which involves electroplating according to a preferred embodiment to form the heat spreader body directly contacting the backside of the die, metallization of the backside of the die according to embodiments is not so limited, and may be performed according to any one of other well known methods, such as, for example, electroplating or electroless plating, sputtering, chemical vapor deposition, and evaporation.

Thus, referring now to the embodiment of FIG. 6a, metallization may be accomplished by first providing a conductive seed layer 140 onto the backside 112 of die 110 as shown, and thereafter, as shown in the embodiment of FIG. 6b, by providing a electrolytically plated metal layer 142 onto the seed layer 140 to form the heat spreader body 138. The seed layer according to embodiments may be made of a material adapted to serve as an electroplating site for a subsequently electrolytically deposited layer. Thus, depending on the material of the layer to be electrolytically deposited, the material of the seed layer may include, by way of example, copper, nickel, or silver, and may be provided using electroless plating or sputtering. If either copper, silver, or another noble metal is used as a seed layer, then, an adhesion/barrier layer would additionally be provided such as Ti/TiN, Ta/TaN etc, as would be recognized by one skilled in the art. Such as an adhesion/barrier layer may be deposited by sputtering, ALD or CVD According to a preferred embodiment, the seed layer includes a layer of copper provided through electroless plating. Referring to FIG. 6a, provision of the seed layer 140 in the shown embodiment results in a partially masked intermediate package combination 144 including the die 110, the substrate 118, the encapsulants 126 and 130, the solder joints 120, the surface mount components 122, the seed layer 140 and the protective mask 136. After provision of the seed layer as shown by way of example in FIG. 6a, the partially masked intermediate package combination may be submerged into a bath of plating solution containing ions of the metal to be electroplated, such as, for example, copper, and an electroplating process may cause the electroplated layer 142 to be formed on the backside of the die. It is noted that, as would be recognized by one skilled in the art, by virtue of the fact that the seed layer 140 serves as a site of atomic nucleation for the electroplated layer 142, once the layer 142 is provided, seed layer 140 would no longer be readily identifiable as such, and is hence no longer shown in FIG. 6b. It is further noted that, while metallization as shown in the embodiment of FIGS. 6a and 6b involves a metallization of a surface of encapsulant 126 flush with the backside of the die, resulting in a heat spreader body 138 that is wider than a width of the die 110 as shown, embodiments of the present invention encompass within their scope the provision of a heat spreader body that has any suitable width, including a width that is smaller than or substantially equal to a width of the die (not shown). According to one embodiment, particles having a thermal conductivity above that of the metal of the heat spreader body, such as, for example, above that of copper, that is, above about 400 W/m/K, may be dispersed in the plating solution. A resulting electroplated layer 142 would then contain the particles entrapped therein after its formation, the particles enhancing a thermal conductivity of layer 142 and hence a thermal performance of the heat spreader body 138. Preferably, the particles have a thermal conductivity between about 100 W/m/K and about 5000 W/m/K. More preferably, the particles are made of diamond.

Thereafter, according to an embodiment, the protective mask may be removed from the landside of the substrate and from a backside of any surface mount components on the landside of the substrate to yield a microelectronic package. Removal of the protective mask may be effected according to any one of well known methods, such as, for example, through peeling.

Figure 7:
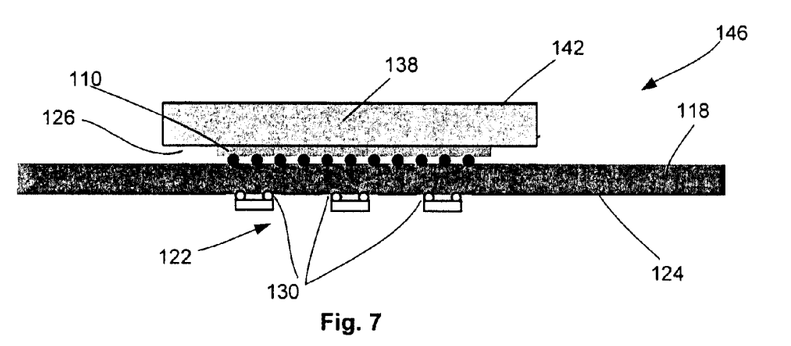
FIG. 7 is a schematic representation of a microelectronic package formed according to an embodiment.

Referring next to FIG. 7 by way of example, a microelectronic package 146 includes a substrate 118 including surface mount components 122 at a landside thereof, a die 110 bonded to the substrate, and a direct contact heat spreader 138 fixed to the backside of the die, that is, a direct contact heat spreader. A microelectronic package formed according to embodiments would include at least a die bonded to a substrate and having a heat spreader body directly contacting and fixed to a backside of the die. It is thus not necessary according to embodiments that the substrate be double-sided, or that there be one or more surface mount components bonded to the landside of the substrate during metallization of the die. In the event that no surface mount components are bonded to the landside of the substrate during metallization, fabrication of a microelectronic substrate would include all of the sub-processes outlined above with respect to the embodiment of FIGS. 1-7, except for the provision of a protective mask on surface mount components (for example, FIG. 5) where metallization is to involve plating. In the latter instance, a protective mask would be provided according to an embodiment to cover an entire landside of the substrate before metallization. Where surface mount components are to be provided on the landside of the substrate, they could in turn be provided after metallization of the backside of the die according to any one of well known methods that could also involve the provision of encapsulant as described above by way of example in FIG. 4.

Figure 8:
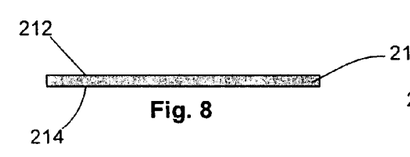
FIG. 8 is a schematic representation of a microelectronic die to be used in a package according to embodiments.
Figure 9A:
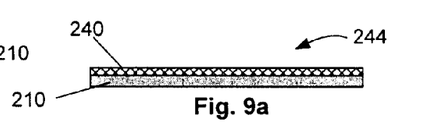
FIGS. 9a and 9b are schematic representations showing a metallization process according to an alternate embodiment.
Figure 9B:
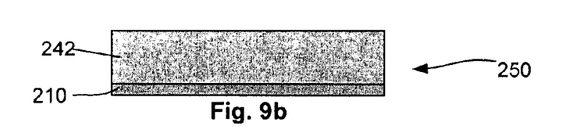

Referring next to FIGS. 8-9b by way of example, an embodiment of the present invention alternative to that shown for example in FIGS. 1-6b comprises providing a microelectronic die, and, before bonding the die to a substrate, metallizing a backside of the die to form a heat spreader body directly contacting and fixed to a backside of the die thereby yielding a die-heat-spreader combination. The provision of a microelectronic die according to an embodiment may involve the provision of a plurality of as yet unsingulated dice on a wafer. Metallization may then involve metallization of a backside of all dice on the wafer, and thereafter singulation in order to obtain individual die-heat-spreader combinations. In the alternative, the provision of a microelectronic die according to another embodiment may involve the provision of an already singulated die. After metallization, to form the microelectronic package similar to the package 146 of FIG. 7, for example, the die-heat-spreader combination may then be bonded to a substrate in any one of well known manners, such as, for example, in the manner described above with respect to FIGS. 2 and 3. Moreover, where the substrate is a double-sided substrate including surface mount components on a landside thereof, encapsulant may be provided between the surface mount components and the landside of the substrate in any one of well known manners, such as, for example, the manner described above with respect to FIG. 4.

Thus, as seen in FIG. 8, a die 220 may be provided similar to die 110 shown in FIG. 1. Thus, die 220 may be either thinned or not thinned according to application needs. Die 220 has an active surface 214 and a backside 212 as shown. Next, as shown in FIGS. 9a and 9b by way of example, metallization of a backside of the die may be effected as described above in relation to the embodiment of FIGS. 6a-6b.

Referring then to FIG. 9b by way of example, metallization according to an embodiment may result in a die-heat-spreader combination, such as die-heat-spreader combination 250 as shown, where a heat spreader body 242 directly contacts and is fixed to the backside 214 of die 210. Similar to FIGS. 6a and 6b, while FIGS. 9a and 9b show metallization stages of the backside 212 of die 210 which involves electroplating according to a preferred embodiment to form a heat spreader body 242, metallization of the backside of the die according to embodiments is not so limited, and, as noted above with respect to FIGS. 6a and 6b, may be performed according to any one of other well known methods, such as, for example, electrolytic plating, sputtering, chemical vapor deposition, and evaporation. Referring now to the embodiment of FIG. 9a, metallization may be accomplished by first providing a conductive seed layer 240 onto the backside 212 of die 210 as shown, and thereafter, as shown in the embodiment of FIG. 9b, by providing an electroplated layer 242 onto the seed layer 240 to form the heat spreader body 238. Similar to FIGS. 6a and 6b, according to an embodiment, the heat spreader body may have a thickness of about 0.3 mm to about 3 mm. As noted above, the seed layer according to embodiments may be made of a material adapted to serve as an electroplating site for a subsequently electrolytically deposited layer. Thus, depending on the material of the layer to be electrolytically deposited, the material of the seed layer may include, by way of example, copper, nickel or silver, and may be provided using electroless plating or sputtering. According to a preferred embodiment, the seed layer includes a layer of copper provided through electroless plating. Referring to FIG. 9a, provision of the seed layer 240 in the shown embodiment results in an intermediate combination 244 including the die 210 and the seed layer 240. After provision of the seed layer as shown by way of example in FIG. 9a, the intermediate combination may be submerged into a bath of ionic solution containing ions of the metal to be electroplated, such as, for example, copper, and an electroplating process may cause the electroplated layer 242 to be formed on the backside of the die 210. It is noted that, by virtue of the fact that, as is would be recognized by one skilled in the art, the seed layer 240 serves as a site of atomic nucleation for the electroplated layer 242, once the copper layer 242 is provided, seed layer 240 would no longer be readily identifiable as such, and is hence no longer shown in FIG. 9b. Although metallization as noted with respect to the embodiments of FIGS. 6a and 6b show a resultant heat spreader body 138 that is wider than a width of the die 110, in the case of an embodiment where a backside of the die is metallized before a bonding of the die to a substrate, such as is the case with respect to FIGS. 9a and 9b, the resultant heat spreader body, such as body 238, may have a width that is generally substantially equal to a width of the die, such as die 210.

Figure 10:
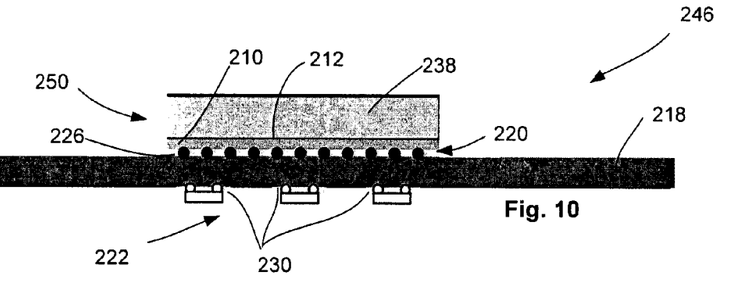
FIG. 10 is a schematic representation of a microelectronic package formed according to an alternate embodiment.

Referring next to FIG. 10 by way of example, embodiments of the present invention contemplate bonding the die-heat-spreader combination, such as combination 250, to a substrate, such as substrate 218, in any one of well known manner in order to yield a microelectronic package 246. Similar to package 146 of the embodiment of FIG. 7, package 246 includes a die 210 bonded to a substrate 218 by way of solder joints 220 and encapsulant 226, a heat spreader body 238 having been formed on a backside of die 210 to form a direct contact heat spreader. Surface mount components 222 are shown as having been provided on the landside of substrate 218, and encapsulant 230 is provided between the surface mount components 222 and the landside of substrate 218, although it is understood that the present invention is not limited to the provision of such surface mount components, or to a double-sided substrate, as elaborated upon with respect to the embodiment of FIG. 7 above.

Preferably, a heat spreader body is provided according to embodiments to adequately remove heat from the die according to application needs. However, if the heat spreader body is not configured to do so, a secondary heat spreader may be attached to the heat spreader body in a number of well known manners. Where a protective mask is used, the secondary heat spreader may be attached either before or after removal of a protective mask as described above in relation to FIG. 6b, according to application needs. The material used to fabricate the secondary heat spreader may include, by way of example, metals (such as copper, aluminum, and alloys thereof), ceramics (such as SiC, and AlN), a heat pipe, or other structures adapted to remove thermal energy. In this context, reference is made to FIG. 11. It is noted at the outset that although FIG. 11 depicts the provision of a secondary heat spreader on a package similar to package 146 of the embodiment of FIG. 7, a secondary heat spreader could equally as well have been provided onto the package 246 of the embodiment of FIG. 10, or onto any other package configuration formed according to embodiments of the present invention as noted above.

Figure 11:
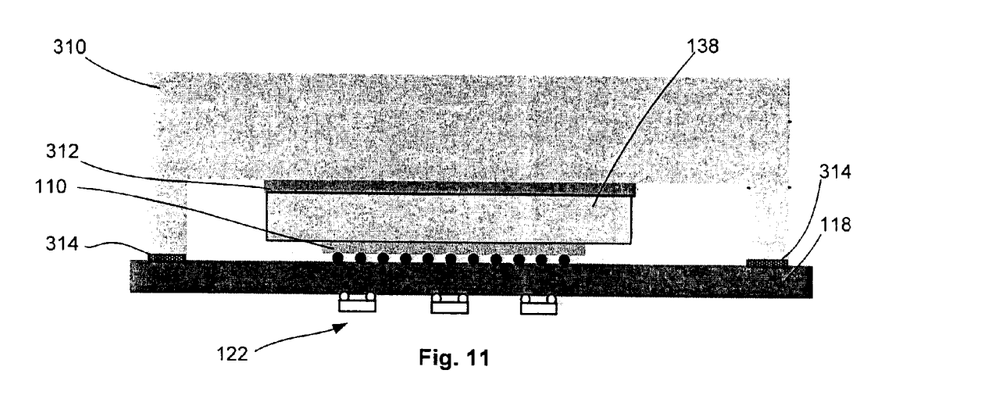
FIG. 11 is schematic representation showing a secondary heat spreader as having been attached to the heat spreader body of the package of FIG. 7.

Referring now to FIG. 11 by way of example, according to some embodiments, attaching a secondary heat spreader to the heat spreader body includes using a thermal interface material to attach the secondary heat spreader to the heat spreader body. According to embodiments, when a secondary heat spreader is attached to the heat spreader body using a thermal interface material, a thickness of the thermal interface material is usually no larger than about 200 microns, and preferably no larger than about 50 microns. The TIM may include, for example, a solder including, for example, In, Sn, or InAg, and may be provided as solder perform. The TIM may also include polymer based materials, for example, a thermally conductive adhesive including a silver particle filled epoxy paste or a ceramic particle filled epoxy paste.

Referring in particular to FIG. 11 by way of example, an additional heat spreader, such as secondary heat spreader 310, may be attached to the heat spreader body, such as heat spreader body 138, by way of a thermal interface material (or "TIM"), such as TIM 312. The secondary heat spreader 310 may further be sealed to the substrate 118 via seals 314 as shown. In the case of FIG. 11, where the package is provided as described with respect to FIGS. 1-6b, it is preferable then for the protective mask 136, as shown in FIGS. 5, 6a and 6b for example, to be removed before or after sealing of the heat sink 310. If the package is provided as described with respect to FIGS. 8-9b (not shown), however, no protective mask would have been needed on the landside of the substrate in the first instance, as explained above.

Figure 12:
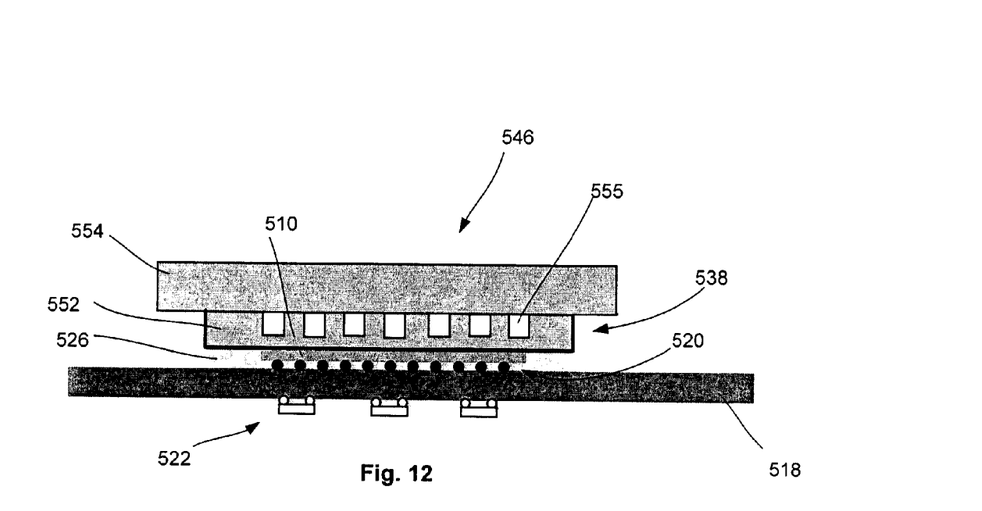
FIG. 12 is a schematic representation of an alternate embodiment of a heat spreader body.

Referring now to FIG. 12 by way of example, an alternative configuration is shown for a package according to an embodiment. FIG. 12 shows a package 546 similar to package 146 of FIG. 7, except that the heat spreader body 538 is not a continuous structure, but rather includes a microchannel structure 552 for liquid cooling as shown. Thus, according to embodiments, it is not necessary that the heat spreader body be a continuous body as shown for example in FIGS. 7 and 10. The heat spreader body according to embodiments may have any shape configured to dissipate heat from the die. The microchannel structure 552 of FIG. 12 may be obtained via a plating of a backside of the die according to any one of methods well known in the art to obtain the shown structure. Thereafter, a flat cover piece 554 made of a material similar to that of the microchannel structure may be attached to the microchannel structure according to any one of well known methods in order to close microchannels 555 of the microchannel structure 552. For example, the cover piece 554 may be attached to the microchannel structure 252 by way of soldering. The resulting structure 256 including a heat spreader body including the microchannel structure 552, to which is attached a cover piece 254 as seen in FIG. 12. Package 546 of FIG. 12 also includes a die 510 bonded to a substrate 518 via solder joints 520 and encapsulant 526, comparable to the configuration of FIG. 7.

Figure 13A:
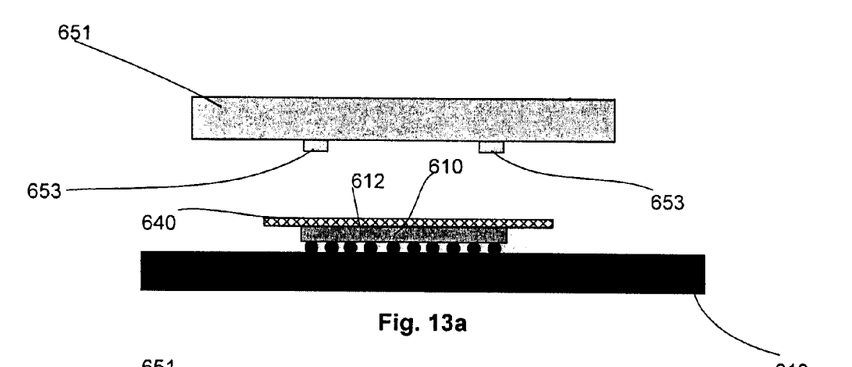
FIGS. 13a-13c are schematic representations showing a metallization process according to yet another embodiment.
Figure 13B:
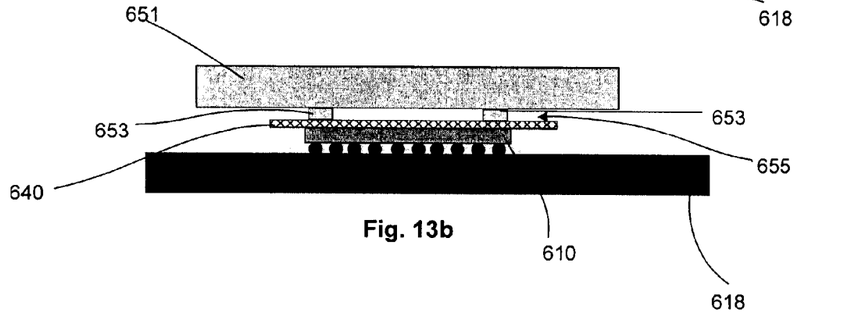
Figure 13C:
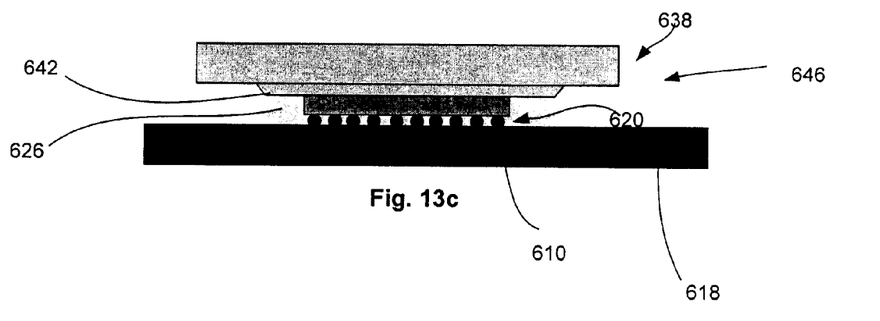

Referring then to FIGS. 13a-13c by way of example, metallization according to an embodiment may involve plating bonding. Referring now to the embodiment of FIGS. 13a and 13b, metallization may be accomplished by providing a conductive seed layer 640 onto the backside 612 of die 610 as shown, and thereafter, by providing a flat copper piece 651 including pedestals 653 at a die side surface thereof onto the seed layer 640. Seeding of the die backside 612 may be accomplished according to any one of the well known methods, such as those described above, for example, with respect to FIG. 6a. Thereafter, as shown in the embodiment of FIG. 13c, a gap 655 between a die side of the copper piece 651 and the backside 612 of the die 610 created by the pedestals 653 is electroplated to yield an electroplated layer 642 onto the seed layer 640 to form the heat spreader body 638. Similar to FIGS. 6a and 6b, according to an embodiment, the heat spreader body may have a thickness of about 0.3 mm to about 3 mm. The resultant structure is a microelectronic package 646 as shown in FIG. 13c, including a substrate 618, onto which a die 610 is bonded via solidified solder joints 620 and encapsulant 626, a direct contact heat spreader or heat spreader body 638 having been provided on the backside of the die according to an embodiment. Advantageously, plating bonding reduces the metallization time with respect to regular plating methods, and thus provides an efficient and cost-effective manner of metallizing the die backside.

An advantageous aspect of a microelectronic package formed according to an embodiment is that, because a provision of the heat spreader body onto the backside of the die occurs at room temperature, a residual stress in the silicon of the substrate is less than or equal to about 50 MPa at room temperature, as opposed to comparable packages of the prior art, where high temperature processing creates much higher residual stresses in the silicon. In addition, at least where plating is used to metallized a backside of the die, a grain boundary and grain orientation of the metal of the heat spreader body at a region of the heat spreader body adjacent the backside of the die may be distinguished with respect to a grain boundary and grain orientation of the metal of the heat spreader body at other regions thereof.

Advantageously, embodiments of the present invention provide a method of fabricating a microelectronic package including a direct contact heat spreader which allows direct contact between the die and the heat spreader for improved heat dissipation capacity when compared with packages of the prior art. Moreover, a method according to embodiments allows the provision of a heat spreader onto the backside of a die at room temperature, thus advantageously reducing stresses on the die produced by a high temperature bonding of the heat spreader to according to the prior art, reducing reliability risks in the die silicon, and minimizing an impact on the performance of circuit components present within the die. Additionally, embodiments allow a cost effective way of providing a heat spreader on the backside of a die by obviating a need for the use of gold, such as used in some packages of the prior art to bond a heat spreader to the die. Moreover, the provision of a direct contact heat spreader according to embodiments, by improving thermal performance, advantageously either obviates the use of the TIM between the die and heat spreader body or, in the alternative, provides for the provision of an additional secondary heat spreader onto the heat spreader body by way of TIM that is typically at least about 50% thinner than TIM's of the prior art. A thinness of a TIM is used according to an embodiment of the present invention is brought about by virtue of the fact that there would be substantially no CTE mismatch between the secondary heat spreader and the direct contact heat spreader.

Figure 14:
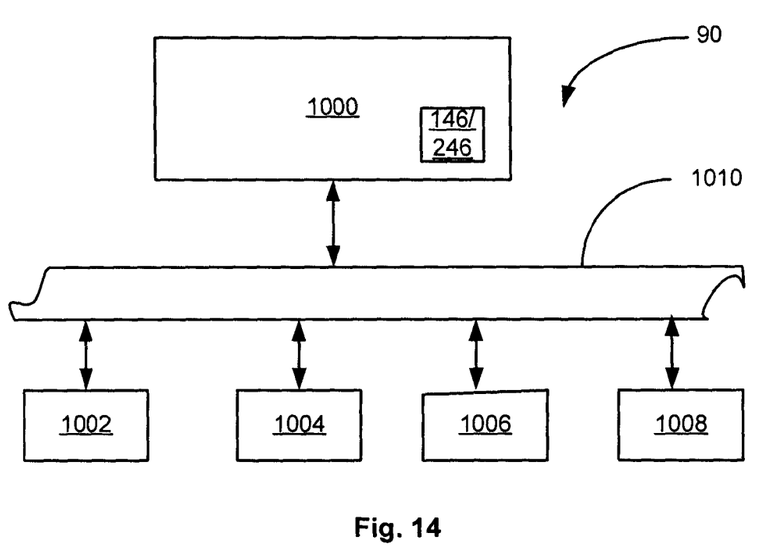
FIG. 14 is a schematic representation of a system incorporating a package according to an embodiment.

Referring to FIG. 14, there is illustrated one of many possible systems in which embodiments of the present invention may be used. The shown system 90 therefore comprises a microelectronic assembly 1000 which includes a package such as, for example, package 146 of FIG. 7 or package 246 of FIG. 10 described above. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 14, the system 90 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 106 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method of fabricating a microelectronic package comprising:
    providing a die having an active surface and a backside;
    bonding the die to a die-side of a microelectronic substrate at the active surface of the die, the microelectronic substrate having a landside opposite the die-side;
    forming an encapsulant around the die, the encapsulant having a top surface co-planar with the backside of the die; and
    subsequent to forming the encapsulant, forming a heat spreader body directly on the entire backside of the die and on the top surface of the encapsulant, wherein the entire heat spreader body is formed by a metallization process, the heat spreader body directly contacting and fixed to the entire backside of the die and to the top surface of the encapsulant and having a thickness greater than 0.2 mm.

2. The method of claim 1, wherein bonding is performed prior to metallizing.

3. The method of claim 1, wherein bonding is performed after metallizing.

4. The method of claim 1, wherein the metallization process comprises at least one of electroless plating, electrolytic plating, plating bonding, sputtering, chemical vapor deposition or evaporation.

5. The method of claim 1, wherein the metallization process comprises plating including:
    providing a conductive seed layer at the backside of the die; and
    providing an electroplated layer onto the seed layer to form the heat spreader body.

6. The method of claim 5, wherein providing a conductive seed layer comprising one of electrolessly plating or sputtering the seed layer at the backside of the die.

7. The method of claim 1, wherein the metallization process comprises metallizing using at least one of copper, a copper alloy, a copper laminate, a copper composite, aluminum or an aluminum alloy.

8. The method of claim 1, wherein the metallization process comprises using a metal composite material comprising a metal and particles having a thermal conductivity above that of the metal.

9. The method of claim 8, wherein the particles comprises diamond particles.

10. The method of claim 1, further comprising providing a protective mask on the landside of the microelectronic substrate to protect the landside of the microelectronic substrate during metallization.

11. The method of claim 10, further comprising bonding at least one surface mount component onto the landside of the microelectronic substrate.

12. The method of claim 11, wherein providing a protective mask comprises providing the mask on a backside of the at least one surface mount component to protect the backside of the at least one surface mount component during metallization.

13. The method of claim 1, wherein bonding comprises:
    forming solder joints between the active surface of the die and the die-side of the microelectronic substrate; and
    forming at least one of an encapsulant or an underfill material in a gap between the active surface of the die and the die-side of the microelectronic substrate.

14. The method of claim 13, further comprising planarizing a backside of the die before forming the heat spreader body.

15. The method of claim 1, wherein the heat spreader body includes a microchannel structure, the method further comprising providing a cover piece onto the microchannel structure.

16. The method of claim 1, further comprising attaching a heat sink onto the heat spreader body using a thermal interface material.

17. A method of fabricating a microelectronic package comprising:
    providing a semiconductor wafer having a plurality of unsingulated die formed thereon, each of the unsingulated die having an active surface and a backside surface;
    forming a heat spreader body directly on the entire backside of each said plurality of unsingulated die by a metallization process, the heat spreader body directly contacting the entire backside of the unsingulated die and having a thickness greater than 0.2 mm;
    singulating the wafer into a plurality of individual die-heat spreader combinations; and
    bonding the active surface of one of said individual die-heat spreader combinations to a die side of a substrate.

18. The method of claim 17 wherein said metallization process comprises forming a seed layer on the backside of the plurality of unsingulated die; and
    electroplating a conductive layer on said seed layer.

19. The method of claim 18 wherein said electroplating occurs at room temperature.

20. The method of claim 18 wherein the metallization comprises copper.

21. The method of claim 17 further comprising forming a thermal interface material on the heat spreader body of said die-heat spreader combination and forming a heat spreader on said thermal interface material and on said substrate.

22. A method of fabricating a microelectronic package comprising:
    providing an die having an active surface and a backside;
    bonding the die to the die side of the substrate at the active surface of the die;
    forming a conductive seed layer on the backside of the die;
    positioning a flat metal piece onto the seed layer, the flat metal piece having pedestals on a die side surface thereof to create a gap between the die side of the metal piece and the backside of the die, wherein the pedestals have a flat bottom surface parallel to a bottom surface of the flat metal piece; and
    electroplating an electroplating layer onto the seed layer to form heat spreader body in the gap between the backside of the die and the metal piece.

23. The method of claim 22 wherein forming the conductive seed layer comprises one of electrolessly plating or sputtering the seed layer at the backside of the die.

24. The method of claim 22 wherein said flat metal piece comprises copper.

25. The method of claim 22 wherein said heat spreader body bonds said metal piece to said die.

26. The method of claim 22 further comprising forming a encapsulate material on said substrate around said die and substantially planar with the backside of said die.

27. The method of claim 26 further comprising forming said conductive seed layer on said encapsulate material and forming said heat spreader body on said conductive layer on said encapsulate material.

\* \* \* \* \*